(12) United States Patent
Ma et al.

(10) Patent No.: US 9,130,511 B2
(45) Date of Patent: Sep. 8, 2015

(54) POWER AMPLIFIER AND LINEARIZATION TECHNIQUES USING ACTIVE AND PASSIVE DEVICES

(75) Inventors: Kai Xue Ma, Singapore (SG); Jiangmin Gu, Singapore (SG); Yang Lu, Singapore (SG); Kiat Seng Yeo, Singapore (SG)

(73) Assignee: Nanyang Technological University, Singapore (SG)

( * ) Notice: Subject to any disclaimer, the term of this patent is extended or adjusted under 35 U.S.C. 154(b) by 44 days.

(21) Appl. No.: 13/880,550

(22) PCT Filed: Oct. 20, 2011

(86) PCT No.: PCT/SG2011/000366
§ 371 (c)(1),
(2), (4) Date: Aug. 29, 2013

(87) PCT Pub. No.: WO2012/053980
PCT Pub. Date: Apr. 26, 2012

(65) Prior Publication Data
US 2013/0335147 A1   Dec. 19, 2013

Related U.S. Application Data

(60) Provisional application No. 61/394,787, filed on Oct. 20, 2010.

(51) Int. Cl.
*H03F 3/191*   (2006.01)
*H03F 3/21*   (2006.01)
*H03F 1/02*   (2006.01)
(Continued)

(52) U.S. Cl.
CPC .............. *H03F 3/21* (2013.01); *H03F 1/0261* (2013.01); *H03F 1/32* (2013.01); *H03F 1/3211* (2013.01); *H03F 1/56* (2013.01); *H03F 3/195* (2013.01); *H03F 3/245* (2013.01); *H03F 3/60* (2013.01); *H03F 3/191* (2013.01);
(Continued)

(58) Field of Classification Search
CPC ..... H03F 2200/387; H03F 1/565; H03F 1/56; H03F 3/60; H03F 3/245; H03F 2200/451; H03F 1/0205; H03F 3/195; H03F 3/19; H03F 3/189; H03F 3/193; H03F 3/2171; H03F 1/302; H03F 1/3205; H03F 2003/45
USPC .................................. 330/277, 296, 306, 307
See application file for complete search history.

(56) References Cited

U.S. PATENT DOCUMENTS 5,146,178 A * 9/1992 Nojima et al. ................ 330/277
5,347,229 A * 9/1994 Suckling et al. ............. 330/306
(Continued)

*Primary Examiner* — Khanh V Nguyen
(74) *Attorney, Agent, or Firm* — K. David Crockett, Esq.; Niky Economy Syrengelas, Esq.; Crockett & Crockett, PC

(57) ABSTRACT

Designs and techniques for improving the linearity of the power amplifiers, especially of the non-linear types, operated in microwave and millimeter-wave frequency using method through purposely designed active transistors or passive devices or both, are disclosed. The techniques use the manipulation of transistors' cut-off frequencies (fT) design, attached loaded linearization stub and characteristics of space attenuation of microwave signals individually or in combination of them. The disclosed techniques provide the advantages to compromise the performance among linearity, gain and power consumption in a wide range of power amplifier types, such as Class-AB, B, C, D, E and F in the different application scenarios.

19 Claims, 11 Drawing Sheets

(51) Int. Cl.
*H03F 1/32* (2006.01)
*H03F 1/56* (2006.01)
*H03F 3/195* (2006.01)
*H03F 3/24* (2006.01)
*H03F 3/60* (2006.01)

(52) U.S. Cl.
CPC ...... *H03F 2200/18* (2013.01); *H03F 2200/222* (2013.01); *H03F 2200/387* (2013.01)

(56) References Cited

U.S. PATENT DOCUMENTS

| | | | |
|---|---|---|---|
| 5,406,224 A * | 4/1995 | Mikami et al. | 330/302 |
| 5,592,122 A * | 1/1997 | Masahiro et al. | 330/305 |
| 6,177,841 B1 * | 1/2001 | Ohta et al. | 330/302 |
| 6,236,274 B1 * | 5/2001 | Liu | 330/302 |
| 6,731,174 B2 * | 5/2004 | Krvavac | 330/302 |
| 8,076,994 B2 * | 12/2011 | Farrell et al. | 330/302 |

* cited by examiner

POWER AMPLIFIER AND LINEARIZATION TECHNIQUES USING ACTIVE AND PASSIVE DEVICES

CROSS-REFERENCE TO RELATED APPLICATION

The present application claims priority to U.S. Provisional Patent Application No. 61/394,787, filed Oct. 20, 2010.

FIELD OF THE INVENTION

The present invention generally relates to power amplifier design, and more particularly relates to power amplifier design linearization techniques suited for any non-linear power amplifier circuits and linearization techniques for non-class-A power amplifier circuits, including Class AB, B, C or Class F power amplifiers.

BACKGROUND OF THE DISCLOSURE

The interest in high level circuit integration and multi-standard communication systems has been a motivating force behind the development of wideband power amplifiers (PAs). Unfortunately, the usable output power and efficiency of a power amplifier degrade severely as the channel bandwidth and the operation frequencies increase. The requirement of linearity is vital in PAs, even with non-constant amplitude modulation schemes, such as QPSK, OFDM and QAM, because they have fluctuating envelopes and high peak to average ratio. The non-linearity of the power amplifier also causes spectrum regrowth as well as intermodulation distortion (IMD), which leads to inter-symbol interference (ISI) and deteriorates bit error rate (BER) in high speed digital communications. Consequently, wireless communication technologies require high linear power amplifier designs to enable the non-constant modulation techniques. Several prior art schemes have been proposed for linearization of power amplifiers. Backoff from P1dB point, predistortion, feedback and feed forward are the most commonly employed schemes.

"Backoff" biases the power amplifier so that the transmitted signal is much smaller than the maximum signal that the power amplifier is able to handle. Thus, the transmitted signal remains in the linear amplifying region. Backoff, however, is essentially paid for by increased power dissipation of the amplifying devices, more wasted power from the power supply, and the cost to implement the transmitter: all of which are limitations to mobile wireless applications.

The second commonly used method is predistortion. Predistortion consists of the insertion of a set of predistorters in the input of the nonlinear devices to be linearized. Minimization of the total intermodulation power is employed to linearize the bandpass response of the amplifier. In most cases, the predistortion is implemented in a digital technique where the analog input signal is converted to the digital format by an A/D converter. The converted digital signal data is then input to the digital signal processor (DSP) for predistortion in a sample-by-sample manner in accordance with the inverse transfer function of the power amplifier. Finally, the processed data is converted back to an analog signal by a D/A converter to serve as the predistorted input to the power amplifier for amplification. This technique offers high suppression of intermodulation distortion. But the high complexity to implement this technique, the integration issues of the silicon area required and the dissipated power limit the application of this technology.

The third method is the feedback technique which exhibits a lower complexity and offers a reasonable intermodulation distortion suppression. In the feedback method, the distortion of the output signal in both amplitude and phase format is sensed and fed-back negatively to the input so that the combination of the original signal and the feedback signal cancel the intermodulation distortion effect. However, the application of this method is limited due to the inherent stability considerations in implementing any feedback system in radio frequency applications.

A further known method is the technique of feed forward linearization. Feed forward linearization employs a scaled down version of the power amplifier so that the output is subtracted from its input to generate an error signal as the distortion. The error signal is then amplified and combined with the main power amplifier's output to cancel the distortion of the PA. This method does not suffer from stability problems and gives good IMD suppression. However, a major drawback of the feed forward technique is high complexity, leading to high cost and sensitivity to temperature and process variations.

Additional conventional methods employ the structures of transmitters and implement the linearization across the whole transceiver structure: in the baseband stage, the IF stage and the power amplifying stage. Yet these methods also add complexity, cost and additional silicon requirements to the transceiver design and implementation.

Thus, what is needed is an efficient power amplifier design and implementation which maintains stability, linearity and usable output power while suppressing IMD without increasing cost, complexity and silicon area required. Furthermore, other desirable features and characteristics will become apparent from the subsequent detailed description and the appended claims, taken in conjunction with the accompanying drawings and this background of the disclosure.

SUMMARY

According to the Detailed Description, a power amplifier linearization technique is provided. The designed high linear power amplifier includes first second and third passive devices and an active amplifying device. The first passive device performs input matching and network biasing. The active amplifying device has parameters tuned to predetermined harmonic frequencies. The second passive device suppresses harmonic frequencies other than predetermined harmonic frequencies. And the third passive device performs output matching and network biasing.

BRIEF DESCRIPTION OF THE DRAWINGS

The accompanying figures, where like reference numerals refer to identical or functionally similar elements throughout the separate views and which together with the detailed description below are incorporated in and form part of the specification, serve to illustrate various embodiments and to explain various principles and advantages in accordance with the present invention.

Skilled artisans will appreciate that elements in the figures are illustrated for simplicity and clarity and have not necessarily been drawn to scale. For example, the dimensions of some of the elements in the figures illustrating integrated circuit architecture may be exaggerated relative to other elements to help to improve understanding of the present and alternate embodiments.

DETAILED DESCRIPTION

The following detailed description is merely exemplary in nature and is not intended to limit the invention or the application and uses of the invention. Furthermore, there is no intention to be bound by any theory presented in the preceding background of the invention or the following detailed description.

A high linear power amplifier is provided to attenuate the harmonics produced by non-linear amplifying devices. The linearization techniques for a millimeter-wave power amplifier comprises an amplifying device with properly selected size and current or voltage biasing to achieve a cut-off frequency at second order harmonics of an interested working frequency and a loaded linearization stub attached to the amplifying device to absorb the second, third and even higher order harmonics.

The high linearization power amplifier is composed of several blocks. An input matching circuit accepts an input signal from an source. A voltage or current biasing circuit, which can be part of the input matching circuit, is used to drive the amplifying device. The amplifying device has three terminals: one is connected to ground, one is connected to a second terminal of the input matching circuit, and the other is connected to the loaded linearization stub. A choke block feeds a voltage power source to the third terminal of the amplifying device so that it provides high impedance. The linearization stub attached to the amplifying device filters out the harmonics to pass clean fundamental amplified frequencies to an output matching circuit. The output matching circuit delivers linearized output signals to a load.

Figure 1:
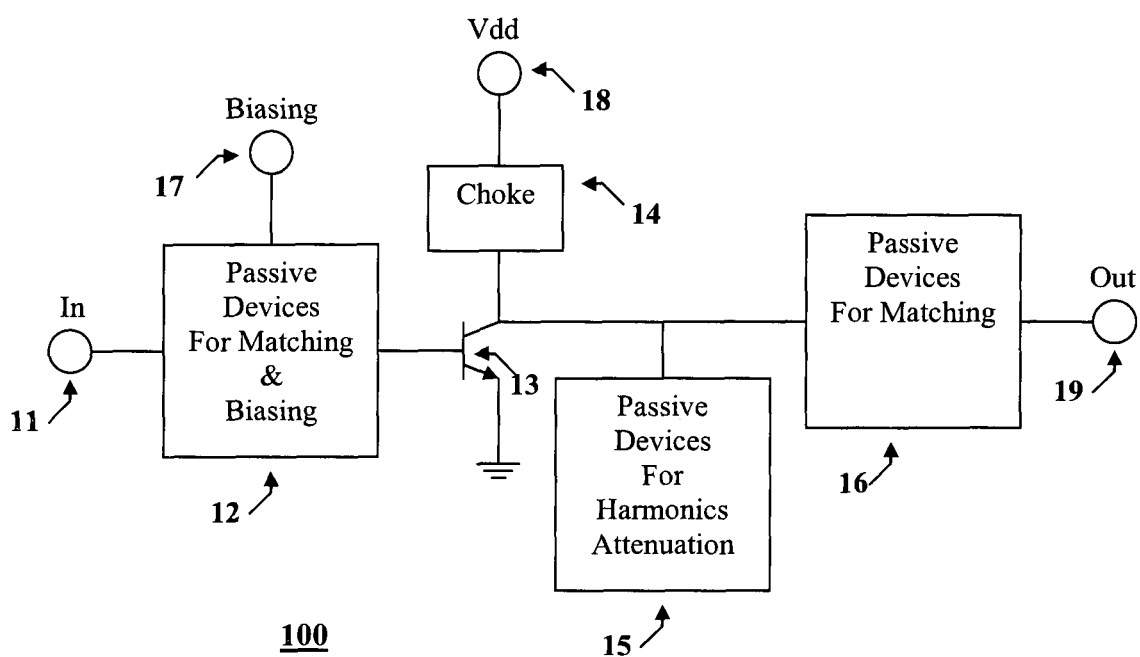
FIG. 1 illustrates a block diagram of a linear power amplifier utilizing cut-off frequency techniques and loaded linearization stub filtering of harmonics in accordance with a present embodiment.

Referring to FIG. 1, a block diagram 100 of the high linear power amplifier employing the linearization techniques of properly selected size and current or voltage biasing to set the device at the required cut-off frequency or maximum oscillation frequency is depicted.

The input signal to the amplifier is applied to an input port 11 which is connected to an input matching and biasing circuit 12 including first passive devices. The proper biasing voltage or current is asserted through the biasing circuit 12 to drive an amplifying device 13 so that the cut-off frequency of the active amplifying device 13 is set at the second order harmonics of a working or desired frequency. The active amplifying device 13 may have three terminals: one is connected to ground, one is connected to a second terminal of the input matching circuit 12, and a third is connected to a loaded linearization stub 15.

A choke block 14 feeds a voltage power source 18 to the third terminal of the amplifying device 13, thereby providing high impedance to the output of the amplifying device. Second passive devices 15 are attached to the amplifying device to filter out the harmonics and to pass the clean fundamental amplified frequencies to third passive devices for an output matching circuit 16 which delivers the linearized output signals to the load through output port 19.

The second passive devices 15 can be absorbed into the third passive devices for output matching 16. The techniques of the active and passive devices in elements 12, 13, 15 and 16 are disclosed in the present embodiment. The amplifying device applicable to the high linear power amplifier in FIG. 1 includes a III-V based HEMT, a MESFET and various HBT transistors, a MOSFET, a SOI transistors, and a wide-band gap transistors, such as in GaN and SiC materials.

Figure 2:
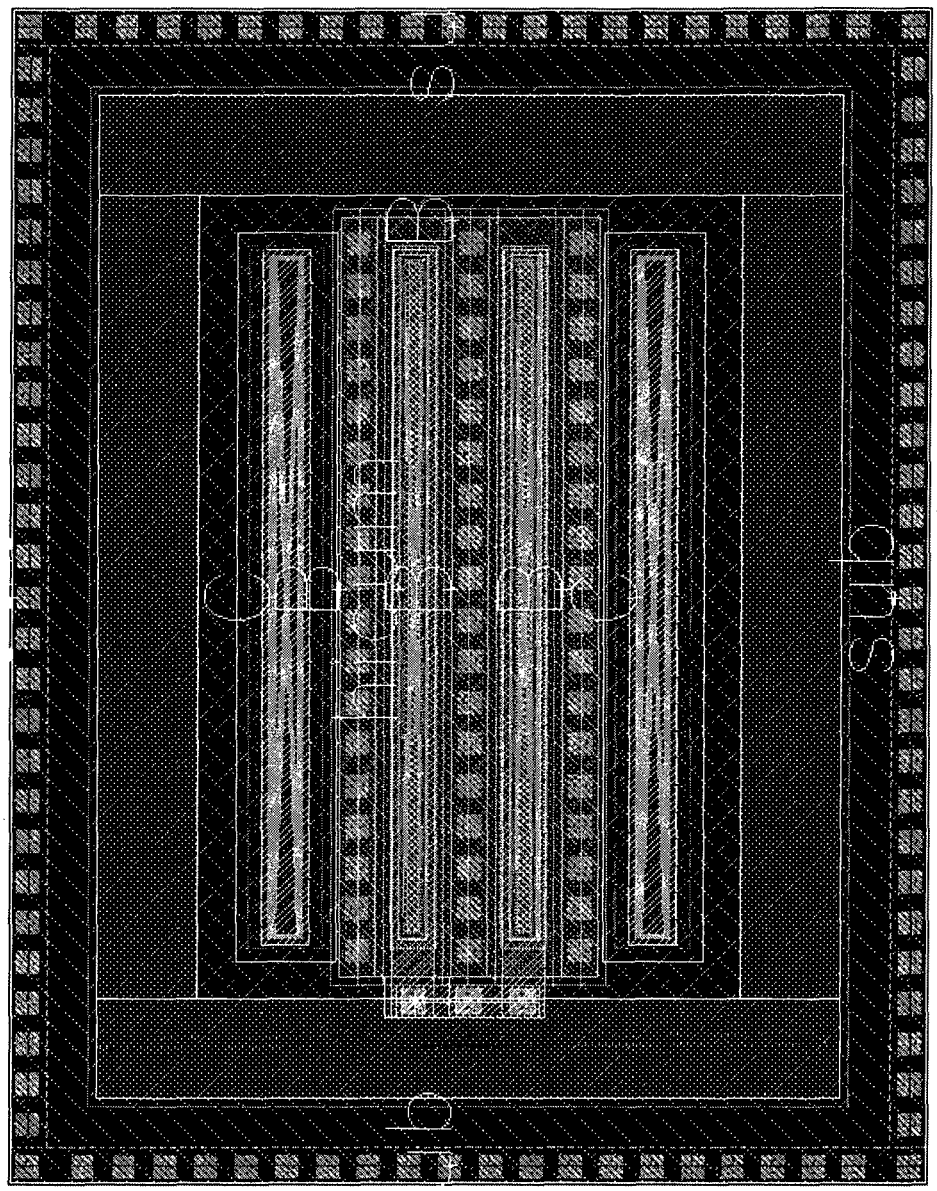
FIG. 2 illustrates an exemplary integrated circuit layout view of the amplifying device of FIG. 1 in accordance with the present embodiment.

Referring to FIG. 2, an exemplary integrated circuit layout view 200 of the amplifying device of FIG. 1 in accordance with the present embodiment is depicted. The view 200 shows the layout of an HBT SiGe process high linear power amplifier.

Figure 3:
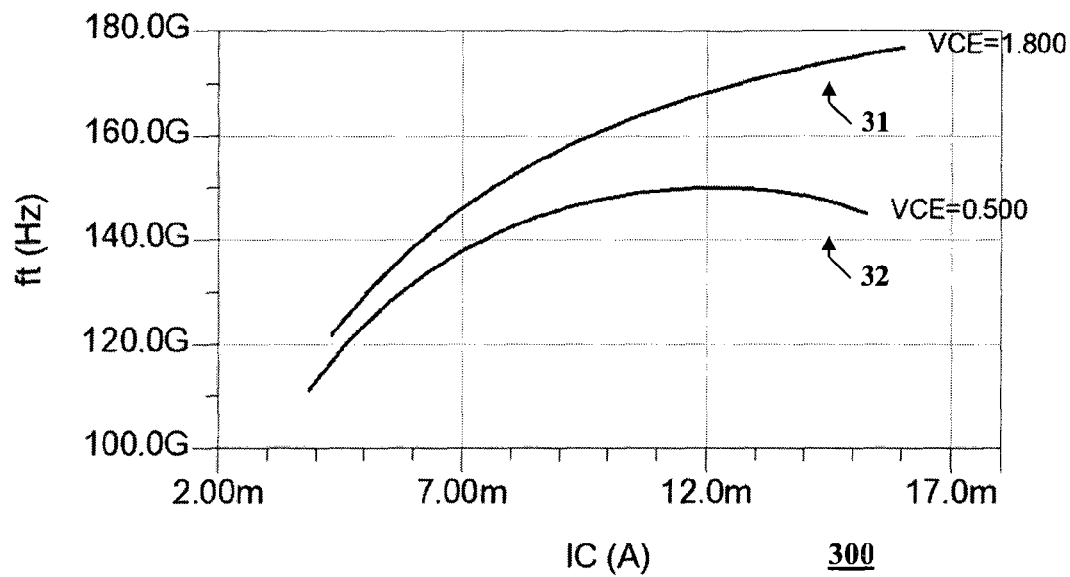
FIG. 3 is a graph illustrating the adjustability of the cut-off frequency of the transistor in response to biasing of the transistor collector current, Ic, in accordance with the present embodiment.

A graph 300 in FIG. 3 shows that the cut-off frequency or unit current gain frequency ($f_T$) is adjustable by the biasing of transistor collector current, Ic. At a given collector-emitter voltage, Vce, and a given transistor size, the cut-off frequency increases with the collector current, as shown by trace 31, or the cut-off frequency increases to a maximum value before dropping when the biasing collector current increases, as shown by trace 32 in FIG. 3.

Figure 4:
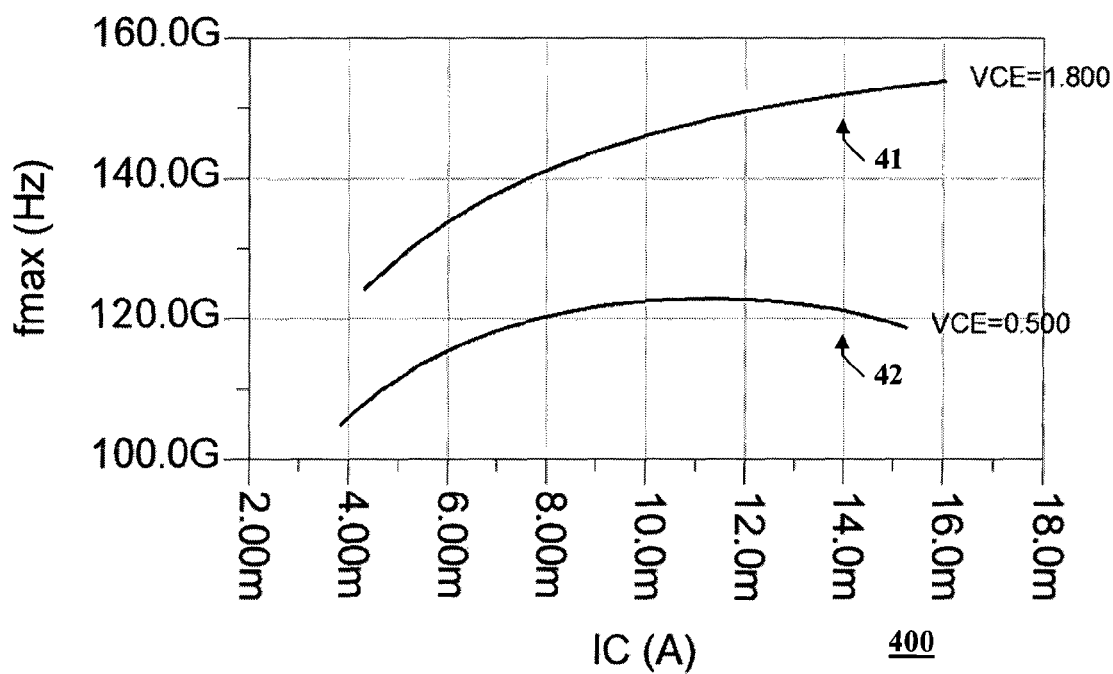
FIG. 4 is a graph illustrating the maximum oscillation frequency of the transistor as adjusted by the biasing of the transistor collector current, Ic, in accordance with the present embodiment.

Referring to FIG. 4, a graph 400 shows that maximum oscillation frequency ($f_{max}$) is adjustable by the biasing of transistor collector current, Ic. At a given collector-emitter voltage, Vce, and a given transistor size, the maximum oscillation frequency increases with the collector current, as shown by trace 41 in FIG. 4. Alternatively, the maximum oscillation frequency increases to a maximum value before dropping when the biasing collector current increases, as shown by trace 42.

Figure 5:
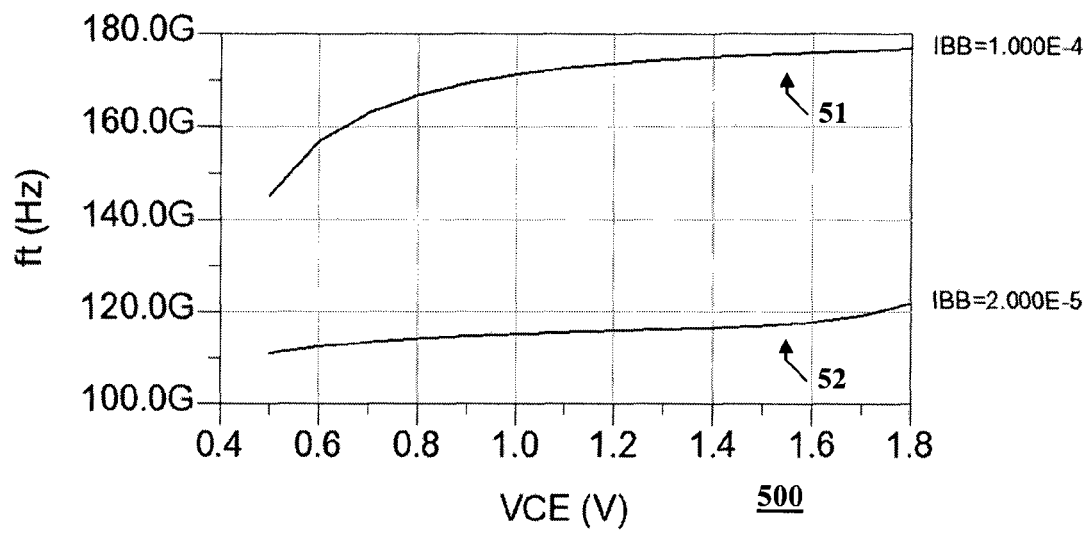
FIG. 5 is a graph illustrating the cut-off frequency of the transistor as adjusted by the biasing of the transistor collector-emitter voltage, Vce, in accordance with the present embodiment.
Figure 6:
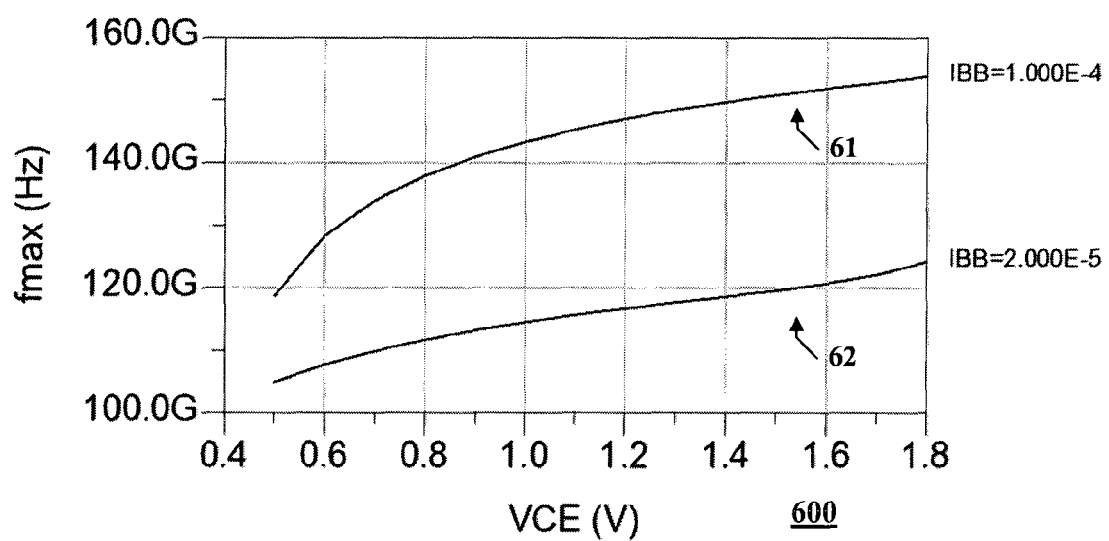
FIG. 6 is a graph illustrating the maximum oscillation frequency of the transistor as adjusted by the biasing of the transistor collector-emitter voltage, Vce, in accordance with the present embodiment.

FIG. 5 depicts a graph 500 that shows the cut-off frequency is adjustable by the biasing of transistor collector-emitter voltage, Vce. At a given base current biasing, and a given transistor size, the cut-off frequency increases with the collector-emitter voltage, as shown by traces 51 and 52. The graph 600 of FIG. 6 also shows that the maximum oscillation frequency is adjustable by the biasing of transistor collector-emitter voltage, Vce. At a given base current biasing, and a given transistor size, the maximum oscillation frequency increases with the collector-emitter voltage, as shown by traces 61 and 62.

Figure 7:
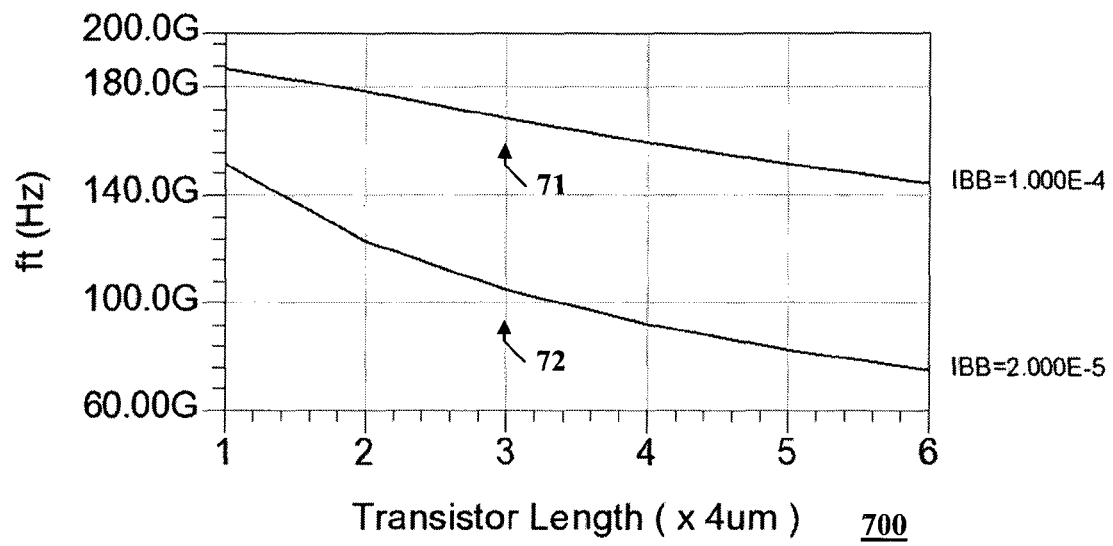
FIG. 7 is a graph illustrating the cut-off frequency of the transistor in relation to the transistor size in accordance with the present embodiment.
Figure 8:
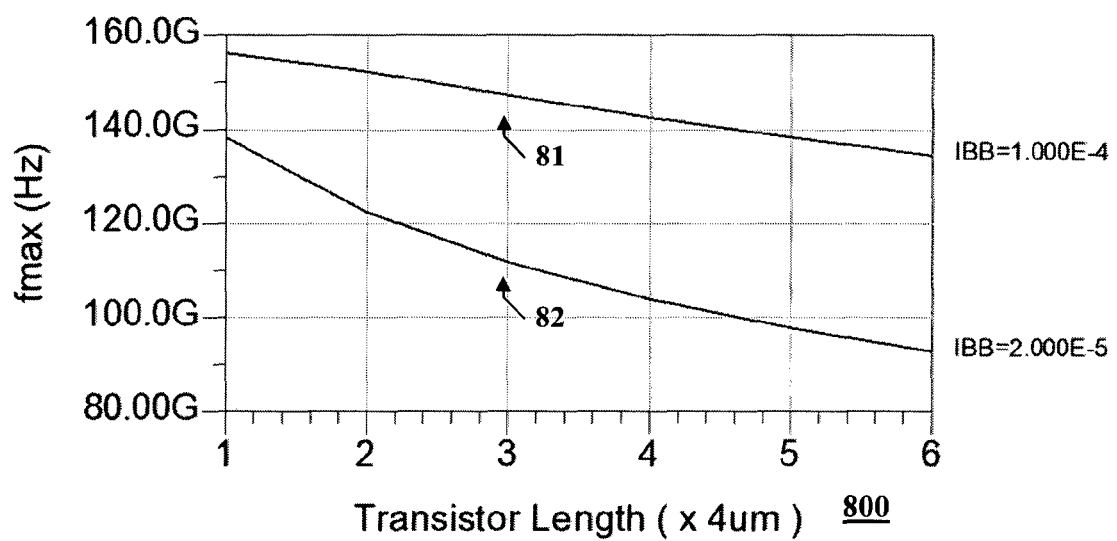
FIG. 8 is a graph illustrating the maximum oscillation frequency of the transistor in relation to the transistor size in accordance with the present embodiment.

Graph 700 of FIG. 7 shows that the cut-off frequency is adjustable by the transistor size. At a given base current and collector-emitter voltage biasing, the cut-off frequency decreases with the increasing of collector-emitter voltage, as shown by traces 71 and 72. Referring to FIG. 8, a graph 800 shows that the maximum oscillation frequency is also adjustable by the transistor size. At a given base current and collector-emitter voltage biasing, the maximum oscillation frequency decreases with the increasing of collector-emitter voltage, as shown by traces 81 and 82. By adjusting the base or collector current, collector-emitter voltage and transistor size, it is the feasible to select the proper cut-off frequency and maximum oscillation frequency for the transistor to fit the linearization requirement in the present embodiment.

Figure 9:
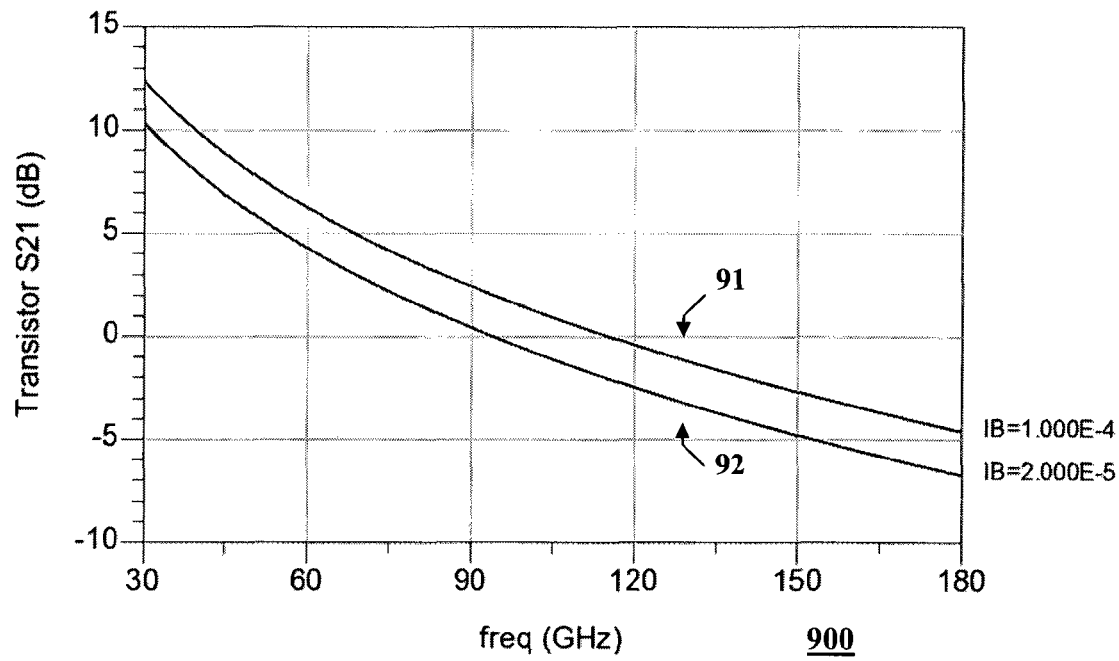
FIG. 9 is a graph illustrating the S21 of the transistor at different cut-off frequencies in accordance with the present embodiment.

The graph 900 of FIG. 9 shows a comparison of the S21 parameter of one active amplifying device with $f_T$=180 GHz in trace 91 and another active amplifying device with $f_T$=120 GHz in trace 92. It can be seen from graph 900 that the attenuation in the second order and third order harmonics of the active amplifying device with $f_T$=180 GHz is larger than that of the active amplifying device with $f_T$=120 GHz.

Figure 10:
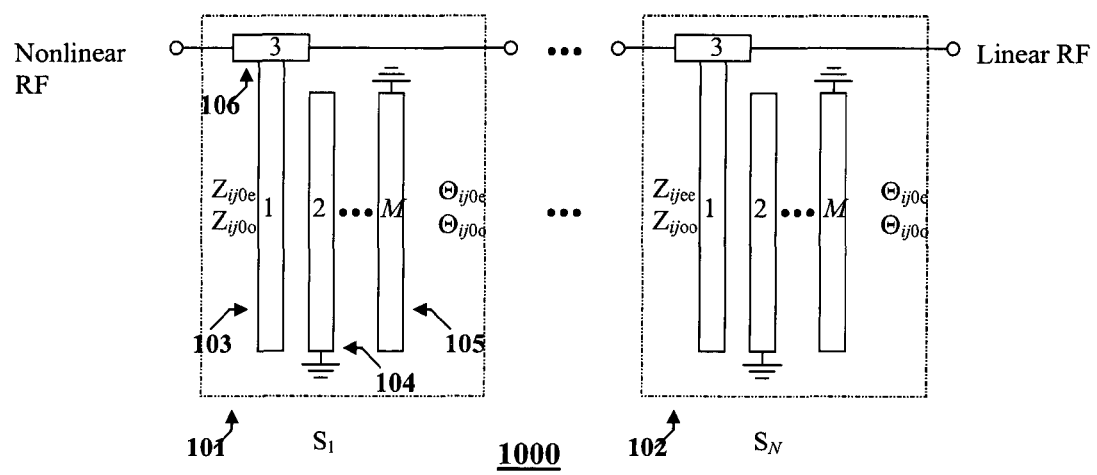
FIG. 10 illustrates a top planar view of a structure including a loaded linearization stub and an open stub and its loaded elements in accordance with the present embodiment.

A first circuit implementation of an embodiment of a loaded linearization stub design 1000 in accordance with the present embodiment is shown in FIG. 10. The loaded linearization stub design 1000 can be connected to the amplifying transistor to further improve linearization performance in accordance with the present embodiment. The loaded linearization stub 1000 is composed of one or several cascaded unit elements 101 and 102 each of which can function at the same harmonic frequency or different order harmonic frequencies. In each unit element, there is a main transmission line 106 connecting between a non-linear RF signal input and a linear RF signal output, and an open stub 103 to notch filter the unwanted harmonic frequency signals. To shrink the length of the open stub 103, one or more loaded elements 104 and 105 can be added. The open stub 103 and the loaded elements 104 and 105 form multiple-stage (M stages, where M is an integer) coupled transmission lines, which present even mode impedance and electric length, $Z_{ij0e}$ and $\Theta_{ij0e}$, as well as odd mode impedance and electric length, $Z_{ij0e}$ and $\Theta_{ij0e}$.

Figure 11:
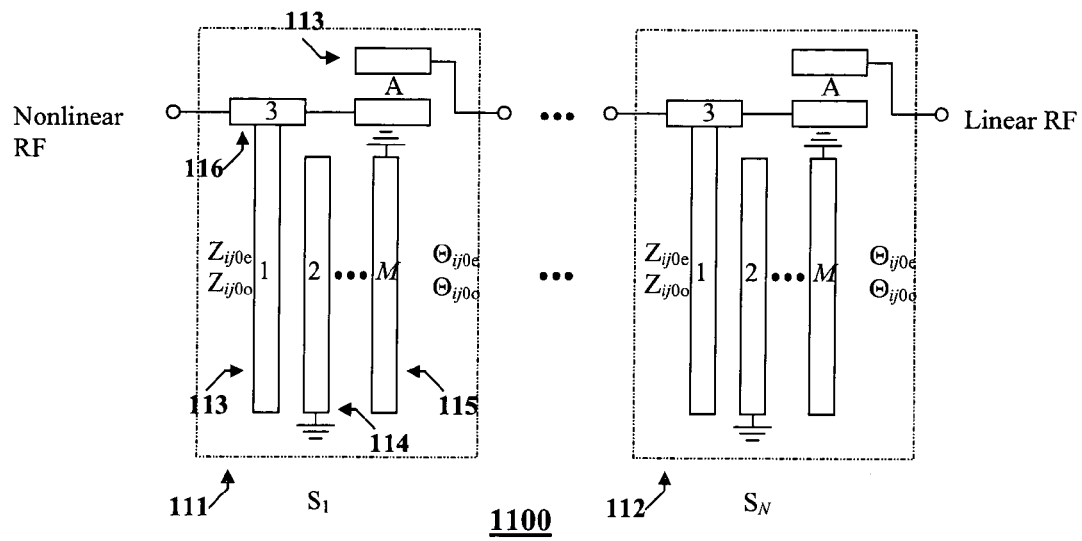
FIG. 11 illustrates a top planar view of a structure of a loaded linearization stub, an open stub and its loaded elements, and a coupling element in accordance with a first alternate embodiment.

A further circuit implementation 1100 of a disclosed embodiment of the loaded linearization stub design is shown in FIG. 11. The implementation 1100 can also be connected to the amplifying transistor to further make linearization performance better in the present embodiment. The loaded linearization stub is composed of one or several cascaded unit elements 111 and 112, each of which can function at the same harmonic frequency or different order harmonic frequencies. In each unit element 111, 112, there is a main transmission line 116, coupling element 113 connecting between the non-linear RF signal input and the linear RF signal output, and an open stub 113 to notch filter the unwanted harmonic frequency signals. The coupling element 113 can be a capacitor or a coupling transmission line. To shrink the length of the open stub 113, one or more loaded elements 114 and 115 can be added. The open stub 113 and the loaded elements 114, 115 form multiple-stage (M stages, where M is an integer) coupled transmission lines, which present both even mode impedance and electric length, $Z_{ij0e}$ and $\Theta_{ij0e}$, and odd mode impedance and electric length, $Z_{ij0e}$ and $\Theta_{ij0e}$.

Figure 12:
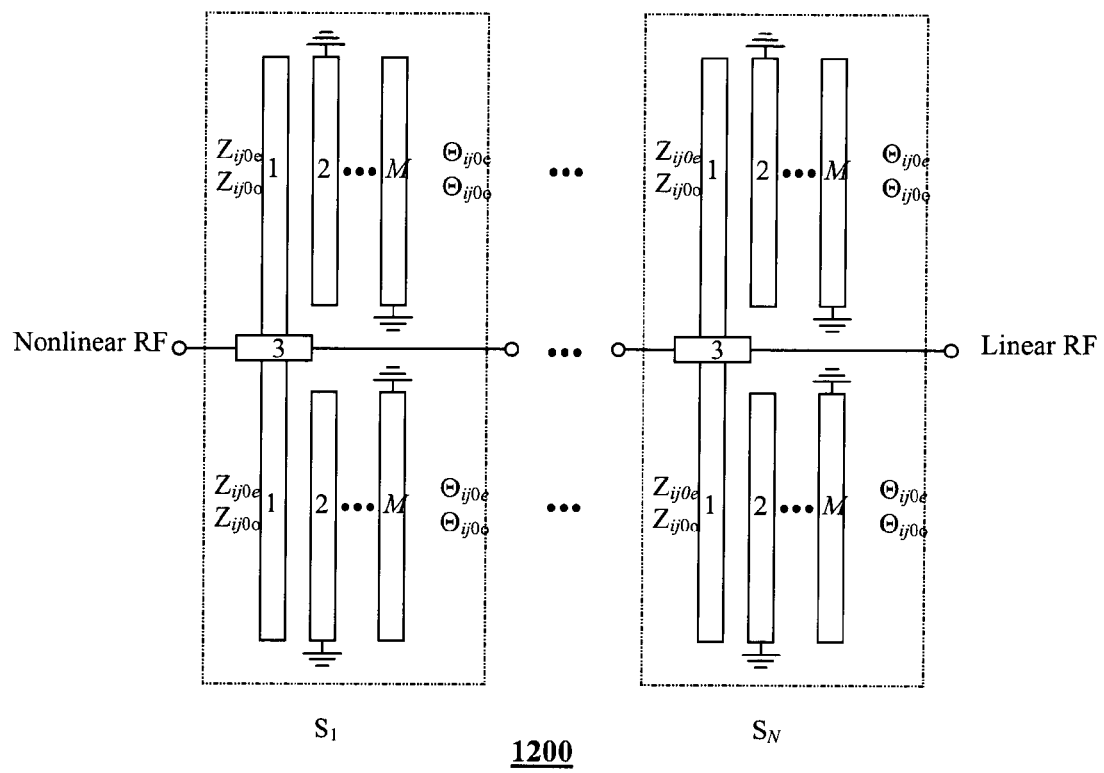
FIG. 12 illustrates a top planar view of a symmetric configuration of the loaded linearization stub in accordance with a second alternate embodiment.

FIG. 12 depicts a symmetric configuration 1200 of the embodiment of the loaded linearization stub design in FIG. 10. The symmetric configuration similarly applies to the disclosed embodiment of the design in FIG. 11.

Figure 13:
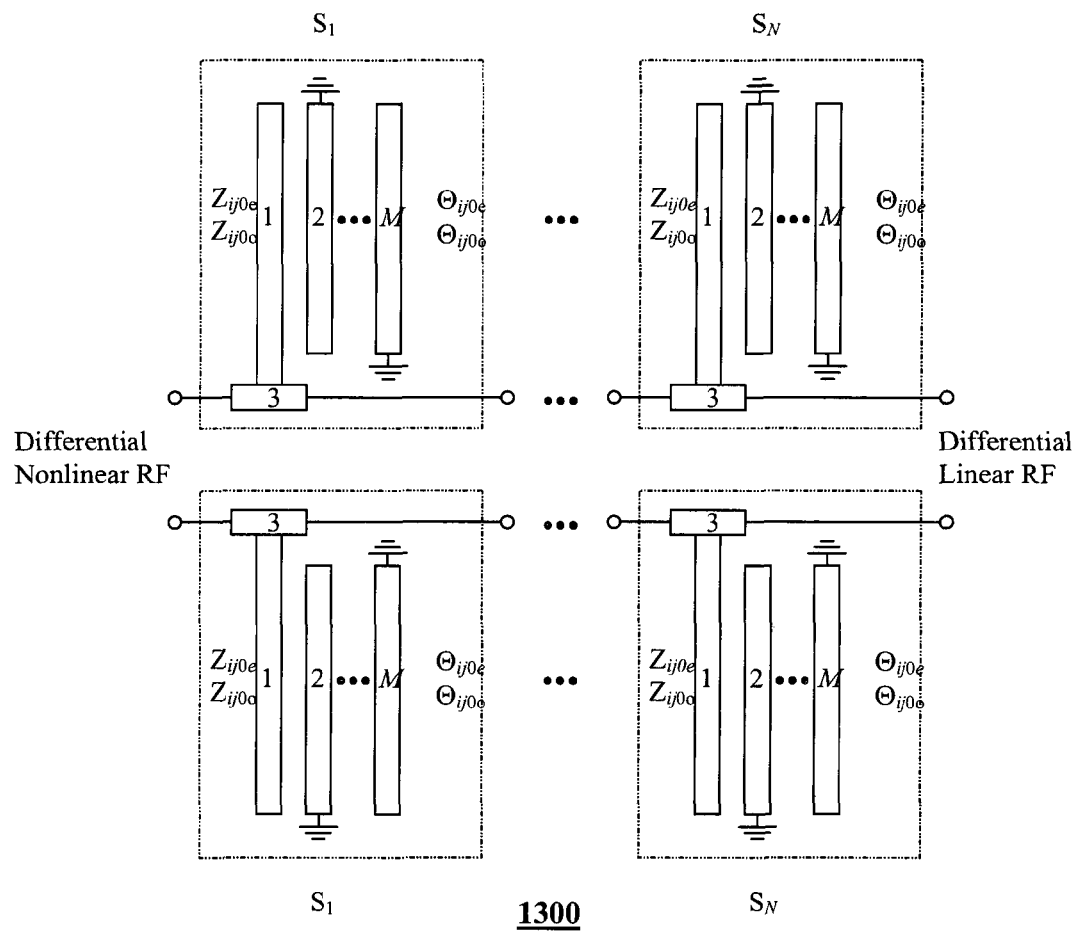
FIG. 13 illustrates a top planar view of a differential drive configuration of the loaded linearization stub in accordance with a third alternate embodiment.

FIG. 13 shows a differential drive configuration 1300 for differential drive circuit applications of the embodiment of the loaded linearization stub design of FIG. 10. The configuration for differential drive application would also be applicable to the disclosed embodiment of the design in FIG. 11.

From FIG. 14 to FIG. 18, several top, right, front perspective views 1400, 1500, 1600, 1700, 1800 depict implementation examples for the passive devices of the present embodiment. Any of these implementations 1400, 1500, 1600, 1700, 1800 may use, but are not limit to the use of, a SiGe process. For example, any of these implementations 1400, 1500, 1600, 1700, 1800 may use other IC processes such as CMOS, GaAs or InP. The implementations 1400, 1500, 1600, 1700, 1800 may be based on a microstrip type structure for the stub and connection transmission lines, but the stub and connection transmission lines may also be implemented through using conventional coplanar waveguides (CPW) or conductor-backed waveguides (CPW). In FIGS. 14 to 18, the metal layers shown as dark and gray regions may be any metal layers or between any two metal layers, such as in an isolate substrate such as $SiO_2$, silicon.

Figure 14:
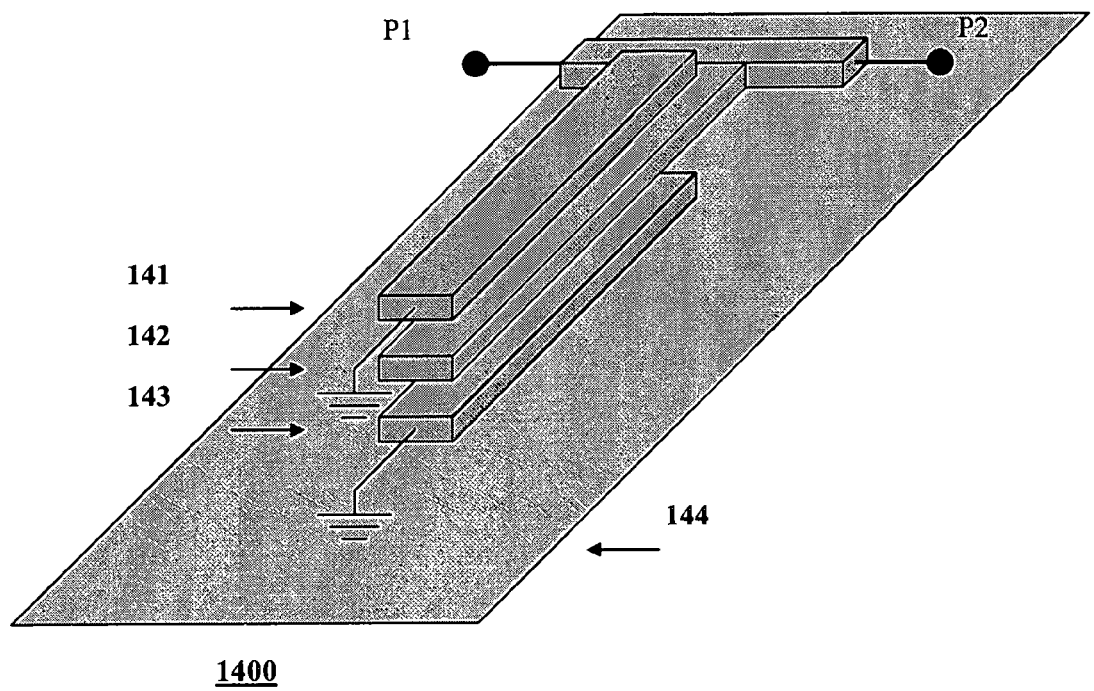
FIG. 14 illustrates a top, right, front perspective view of a vertical structure of the open stub and its loaded elements wherein each of the loaded elements is implemented in different metal layers and located on both sides of the open stub in accordance with an alternate embodiment of the present embodiment.

A first implementation 1400 of the open stub and its loaded elements in FIG. 10 in microstrip structure for the present invention is shown in FIG. 14, where all the elements are fabricated in different metal layers in standard SiGe 1P6M process. In the implementation 1400, the loaded elements 141 and 143 are located in the metal layers 6 and 4, respectively, while the open stub 142 is fabricated in metal layer 5. The loaded elements have one of the ends connected to ground 144. The implementation 1400 may be modified to different configurations. For example, 141, 142 and 143 may use other metal layers or a different order of the metal layers. Also, the bottom ground may be formed as a different kind of patterned ground.

Figure 15:
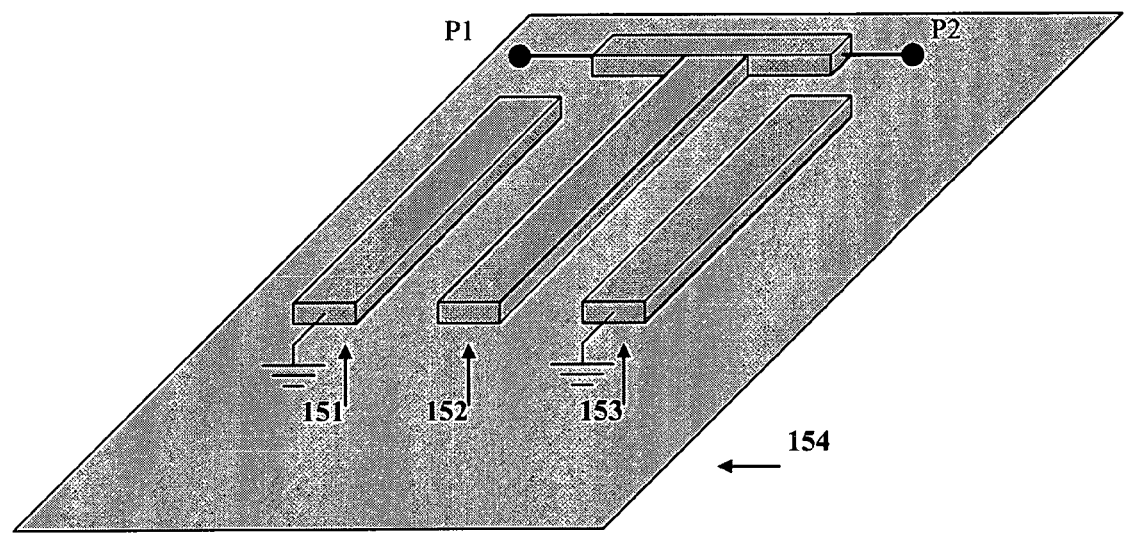
FIG. 15 illustrates a top, right, front perspective view of a horizontal structure of the open stub and the loaded elements wherein each of the loaded elements is implemented in the same metal layer and located on both sides of the open stub in accordance with an alternate embodiment of the present embodiment.

A further implementation 1500 of the open stub and its loaded elements in microstrip structure in accordance with the present embodiment is shown in FIG. 15, where all the elements are fabricated in the same metal layer in a standard SiGe 1P6M process. In the implementation 1500, the loaded elements 151 and 153 and the open stub 152 are fabricated in metal layer 6. The loaded elements have one of the ends connected to the ground 154.

Figure 16:
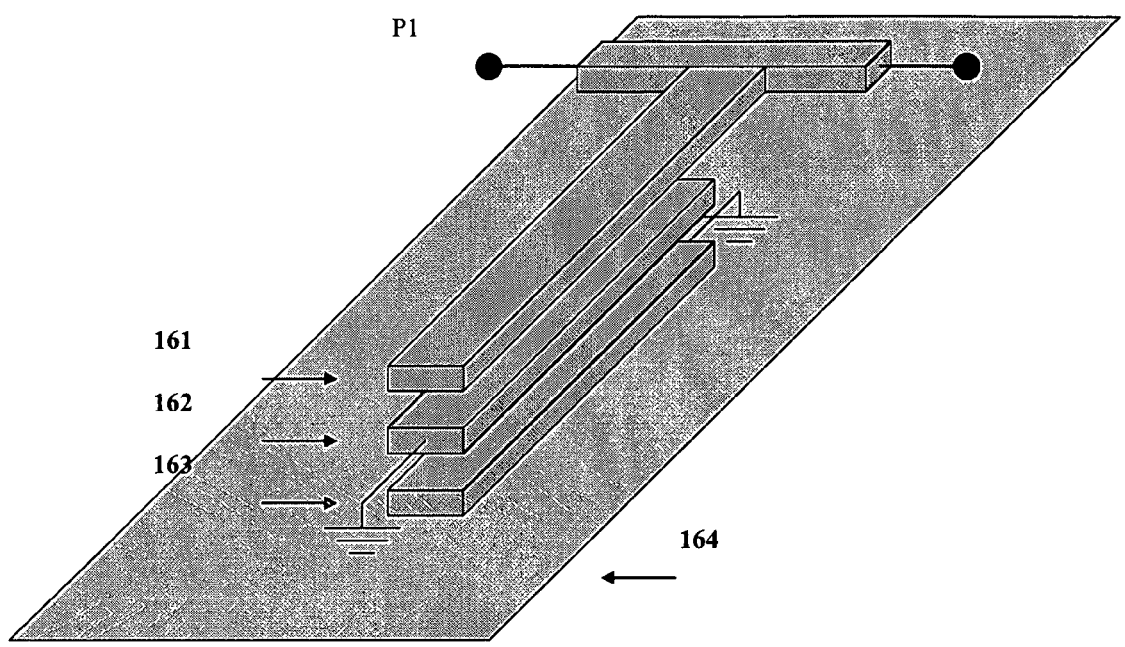
FIG. 16 illustrates a top, right, front perspective view of a vertical structure of the open stub and the loaded elements wherein each of the loaded elements is implemented in different metal layers and located on one side of the open stub in accordance with an alternate embodiment of the present embodiment.

A further implementation 1600 of the open stub and its loaded elements in microstrip structure is shown in FIG. 16, where all the elements are fabricated in different metal layers in a standard SiGe 1P6M process. In the implementation 1600, the loaded elements 162 and 163 are located in the metal layers 5 and 4, respectively, while the open stub 161 is fabricated in metal layer 6. The loaded elements have one of the ends connected to the ground 164.

Figure 17:
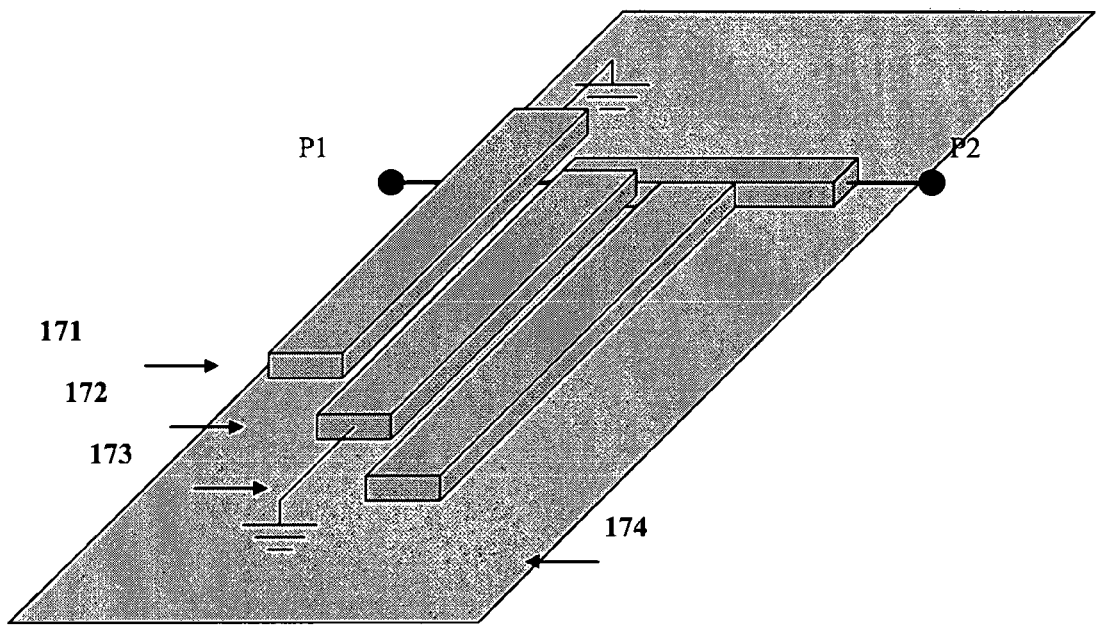
FIG. 17 illustrates a top, right, front perspective view of a structure of the open stub and the loaded elements wherein each of the loaded elements is implemented in different metal layers with vertical or horizontal offset in accordance with an alternate embodiment of the present embodiment.

Another implementation 1700 of the open stub and its loaded elements in microstrip structure is shown in FIG. 17, where all the elements are fabricated in different metal layers in a standard SiGe 1P6M process but with vertical or horizontal position offset. In the implementation 1700, the loaded elements 171 and 172 are located in metal layers 6 and 5, while the open stub 173 is fabricated in metal layer 4. The loaded elements are to the left of the open stub and have one of the ends connected to the ground 174. However, implementation 1700 is not limited to this one version—the loaded elements can be located to the right of the open stub and in upper metal layers, or the loaded elements can be located to the left of the open stub and in lower metal layers, or the loaded elements can be located to the right of the open stub and in lower metal layers.

Figure 18:
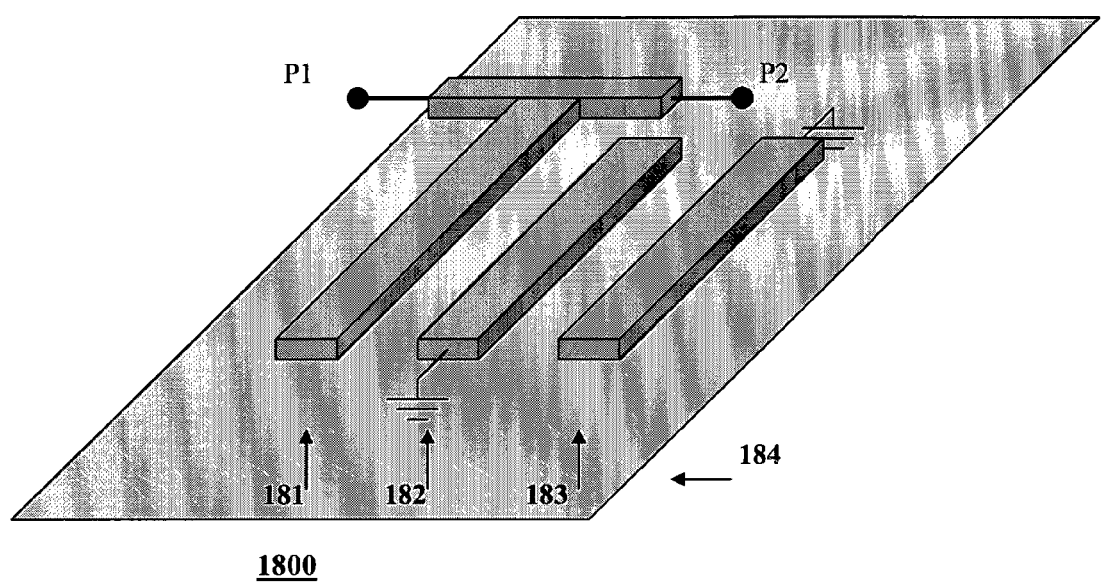
FIG. 18 illustrates a top, right, front perspective view of a horizontal structure of the open stub and the loaded elements wherein all of the loaded elements are implemented in the same metal layer and located on one side of the open stub in accordance with an alternate embodiment of the present embodiment.

A further implementation 1800 of the open stub and its loaded elements in microstrip structure for the present invention is shown in FIG. 18, where all the elements are fabricated in the same metal in a standard SiGe 1P6M process. In the implementation 1800, the loaded elements 182 and 183 and the open stub 181 are fabricated in metal layer 6. The loaded elements are to the right of the open stub and have one of the ends connected to ground 184. In a similar implementation, the loaded elements can be located to the left of the open stub.

Various embodiments may provide a power amplifier including a first passive device for input matching and network biasing; an active amplifying device having parameters tuned to predetermined harmonic frequencies; a second passive device for suppression of harmonic frequencies other than the predetermined harmonic frequencies; and a third passive device for output matching and network biasing.

In various embodiments, the first passive device may be coupled to receive an input high frequency signal and perform biasing of one or more of current and voltage of the input high frequency signal, and the third passive device coupled to receive a power supply current and matches an output RF signal to a load of the high linear power amplifier. The active amplifying device may be tuned to the predetermined harmonic frequencies in response to tuning intrinsic parameters of the active amplifying device including a cut-off frequency and a maximum oscillation frequency thereof. The active amplifying device may tune the intrinsic parameters thereof by asserting a group of proper values for a collector current, a collector-emitter voltage and a transistor size of the active amplifying device necessary to produce a predetermined gain at a fundamental frequency of the input high frequency signal and suppress harmonic frequencies of the input high frequency signal.

In various embodiments, the power amplifier may further include a loaded linearization stub coupled to the active amplifying device, wherein the loaded linearization stub includes one or more cascaded unit elements operating at one or more of the predetermined harmonic frequencies and different orders of the predetermined harmonic frequencies. For example, the one or more cascaded unit elements may be connected to one another by one or more devices selected from the group of devices including transmission lines, inductors and capacitors.

In various embodiments, each of the one or more cascaded unit elements may include a main transmission line, an open stub with a first end connected to the main transmission line, and one or more loaded elements, wherein each of the one or more loaded elements having a first end openended and a second end connected to ground. The loaded elements can be located at one or more positions relative to the open stub selected from the group of relative positions including (a) a position left and a position right of the open stub, (b) a position above and a position below the open stub, and (c) and positions to the same side of upper, lower, left and right of the open stub.

In various embodiments, each of the one or more cascaded unit elements may include a main transmission line, a coupling element, an open stub, and one or more loaded elements. The coupling element may be selected from the group including a metal-insulator-metal capacitor, a poly-insulator-poly capacitor, a MOS capacitor, a MOS varactor, a p-n varactor, an inter-digital capacitor, other capacitive coupling elements, edge-coupled lines, and broad side coupled lines. The open stub may have a first end open-ended and a second end connected to ground, and the open stub may be coupled to the main transmission line and the one or more loaded elements to form an electromagnetic field for generating a loading effect to reject unwanted nonlinearity spurious signals while enabling a compact size and a resonating effect of the power amplifier.

In various embodiments, the transmission line, including the main transmission line, may be selected from the group including microstrip lines, coplanar waveguides, and strip lines. A shape of the transmission line, including a shape of the main transmission line, may be selected from the group including meander-lines, folded lines, spiral lines, and fish bone lines.

In various embodiments, the open stub and the loaded elements may be selected from the group including microstrip lines, coplanar waveguides, and strip lines, and other structures of transmission lines.

In various embodiments, an impedance across the loaded linearization stub has an impedance value of substantially 50 Ohms.

In various embodiments, the active amplifying device may operate at a frequency of 10 GHz and above. The active amplifying device may include one or more devices selected from the group including a III-V based HEMT, aMESFET, a HBT transistor, a MOSFET, a SOI transistor; a GaN wide-band gap transistor, and a SiC wide-band gap transistor.

In various embodiments, the power amplifier may include a non-class A power amplifier, including Class AB, Class B, Class C, and Class F power amplifiers.

In various embodiments, the input high frequency signal may be selected from the group including an RF signal, a microwave signal and a millimeter-wave signal.

In various embodiments, the active amplifying device and the second passive device may utilize intrinsic high space loss of the harmonic frequencies and the active amplifying device may utilize transistor improvement techniques in response to the input high frequency signal having a frequency in the range of 10 GHz and above. Operational frequencies for the first, second and third passive devices may be the operational frequencies both below and above 10 GHz.

Thus it can be seen that an efficient power amplifier design and implementation which maintains stability, linearity and usable output power while suppressing IMD without increasing cost, complexity and silicon area required has been provided. Further, improved linearization techniques for a millimeter-wave power amplifier include selecting an amplifying device with proper size and current or voltage biasing to achieve a cut-off frequency at second order harmonics of an interested working frequency and connecting it to a loaded linearization stub to absorb the second, third and even higher order harmonics. While several exemplary embodiments have been presented in the foregoing detailed description of the invention, it should be appreciated that a vast number of variations exist, including variations as to the materials used to form the various layers of the magnetic recording medium.

It should further be appreciated that the exemplary embodiments are only examples, and are not intended to limit the scope, applicability, dimensions, or configuration of the invention in any way. Rather, the foregoing detailed description will provide those skilled in the art with a convenient road map for implementing an exemplary embodiment of the invention, it being understood that various changes may be made in the function and arrangement of elements and method of play steps described in an exemplary embodiment without departing from the scope of the invention as set forth in the appended claims.

What is claimed is:

1. A power amplifier comprising:
   a first passive device for input matching and network biasing;
   an active amplifying device having parameters tuned to predetermined harmonic frequencies;
   a second passive device for suppression of harmonic frequencies other than the predetermined harmonic frequencies; and
   a third passive device for output matching and network biasing; and
   a loaded linearization stub coupled to the active amplifying device, wherein the loaded linearization stub comprises one or more cascaded unit elements operating at one or more of the predetermined harmonic frequencies and different orders of the predetermined harmonic frequencies.

2. The power amplifier in accordance with claim 1 wherein the first passive device is coupled to receive an input high frequency signal and perform biasing of one or more of current and voltage of the input high frequency signal, and wherein the third passive device coupled to receive a power supply current and matches an output RF signal to a load of the high linear power amplifier.

3. The power amplifier in accordance with claim 1 wherein the active amplifying device is tuned to the predetermined harmonic frequencies in response to tuning intrinsic parameters of the active amplifying device including a cut-off frequency and a maximum oscillation frequency thereof.

4. The power amplifier in accordance with claim 3 wherein the active amplifying device tunes the intrinsic parameters thereof by asserting a group of proper values for a collector current, a collector-emitter voltage and a transistor size of the active amplifying device necessary to produce a predetermined gain at a fundamental frequency of the input high frequency signal and suppress harmonic frequencies of the input high frequency signal.

5. The power amplifier in accordance with claim 1 wherein the one or more cascaded unit elements are connected to one another by one or more devices selected from the group of devices including transmission lines, inductors and capacitors.

6. The power amplifier in accordance with claim 1 wherein each of the one or more cascaded unit elements comprises a main transmission line, an open stub with a first end connected to the main transmission line, and one or more loaded elements, wherein each of the one or more loaded elements having a first end openended and a second end connected to ground.

7. The power amplifier in accordance with claim 6 wherein the loaded elements can be located at one or more positions relative to the open stub selected from the group of relative positions comprising (a) a position left and a position right of the open stub, (b) a position above and a position below the open stub, and (c) and positions to the same side of upper, lower, left and right of the open stub.

8. The power amplifier in accordance with claim 1 wherein each of the one or more cascaded unit elements comprises a main transmission line, a coupling element, an open stub, and one or more loaded elements.

9. The power amplifier in accordance with claim 8 wherein the coupling element is selected from the group comprising a metal-insulator-metal capacitor, a poly-insulator-poly capacitor, a MOS capacitor, a MOS varactor, a p-n varactor, an inter-digital capacitor, other capacitive coupling elements, edge-coupled lines, and broad side coupled lines.

10. The power amplifier in accordance with claim 8 wherein the open stub has a first end open-ended and a second end connected to ground, and wherein the open stub is coupled to the main transmission line and the one or more loaded elements to form an electromagnetic field for generating a loading effect to reject unwanted nonlinearity spurious signals while enabling a compact size and a resonating effect of the power amplifier.

11. The power amplifier in accordance with claim 6 wherein the transmission line, including the main transmission line, is selected from the group comprising microstrip lines, coplanar waveguides, and strip lines.

12. The power amplifier in accordance with claim 6 wherein a shape of the transmission line, including a shape of the main transmission line, is selected from the group comprising meander-lines, folded lines, spiral lines, and fish bone lines.

13. The power amplifier in accordance with claim 6 wherein the open stub and the loaded elements are selected from the group comprising microstrip lines, coplanar waveguides, and strip lines, and other structures of transmission lines.

14. The power amplifier in accordance with claim 1 wherein the active amplifying device operates at a frequency of 10 GHz and above.

15. The power amplifier in accordance with claim 1 wherein the active amplifying device comprises one or more devices selected from the group comprising a III-V based HEMT, aMESFET, a HBT transistor, a MOSFET, a SOI transistor; a GaN wide-band gap transistor, and a SiC wide-band gap transistor.

16. The power amplifier in accordance with claim 1 wherein the power amplifier comprises a non-class A power amplifier, including Class AB, Class B, Class C, and Class F power amplifiers.

17. The power amplifier in accordance with claim 2 wherein the input high frequency signal is selected from the group comprising an RF signal, a microwave signal and a millimeter-wave signal.

18. The power amplifier in accordance with claim 2 wherein the active amplifying device and the second passive device utilize intrinsic high space loss of the harmonic frequencies and the active amplifying device utilizes transistor improvement techniques in response to the input high frequency signal having a frequency in the range of 10 GHz and above.

19. The power amplifier in accordance with claim 18 wherein operational frequencies for the first, second and third passive devices are the operational frequencies both below and above 10 GHz.

\* \* \* \* \*